(12) United States Patent
Oh et al.

(10) Patent No.: US 9,543,349 B2
(45) Date of Patent: Jan. 10, 2017

(54) CMOS IMAGE SENSORS HAVING A TRANSFER GATE ELECTRODE, AND METHODS OF FABRICATING CMOS IMAGE SENSORS HAVING A TRANSFER GATE ELECTRODE

(71) Applicant: Samsung Electronics Co., Ltd., Suwon-si (KR)

(72) Inventors: Young-Sun Oh, Yongin-si (KR); Kyung-Ho Lee, Suwon-si (KR); Hee-Geun Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 14/478,374

(22) Filed: Sep. 5, 2014

(65) Prior Publication Data
US 2015/0243701 A1    Aug. 27, 2015

(30) Foreign Application Priority Data

Feb. 25, 2014    (KR) .................. 10-2014-0022129

(51) Int. Cl.
*H01L 27/146*    (2006.01)

(52) U.S. Cl.
CPC ..... *H01L 27/14643* (2013.01); *H01L 27/1463* (2013.01); *H01L 27/14603* (2013.01); *H01L 27/14612* (2013.01); *H01L 27/14614* (2013.01); *H01L 27/14616* (2013.01); *H01L 27/14689* (2013.01)

(58) Field of Classification Search
CPC ............. H01L 27/14643; H01L 27/14614; H01L 27/14616; H01L 27/14603; H01L 27/14689; H01L 27/14612
See application file for complete search history.

(56) References Cited

U.S. PATENT DOCUMENTS

| 7,759,263 B2 | 7/2010 | Sohn et al. | |
| 8,143,626 B2 | 3/2012 | Lee | |
| 2006/0273344 A1* | 12/2006 | Lee | H01L 21/28079 257/137 |
| 2007/0267658 A1* | 11/2007 | Song | H01L 27/14609 257/211 |

FOREIGN PATENT DOCUMENTS

| KR | 1020030037855 A | 5/2003 |
| KR | 100789575 B1 | 12/2007 |

* cited by examiner

*Primary Examiner* — Fernando L Toledo
*Assistant Examiner* — Lawrence-Linh T Nguyen
(74) *Attorney, Agent, or Firm* — Myers Bigel, P.A.

(57) ABSTRACT

Complementary metal-oxide-semiconductor (CMOS) image sensors are provided. A CMOS image sensor includes a substrate including a pixel array and a peripheral circuit region, a photodiode and a floating diffusion region in the pixel array of the substrate, a transfer gate insulating layer and a transfer gate electrode on the substrate between the photodiode and the floating diffusion region, and a peripheral gate insulating layer and a peripheral gate electrode on the peripheral circuit region. The transfer gate electrode includes a first edge that is rounded to have a first radius of curvature, and the peripheral gate electrode includes a second edge that is rounded to have a second radius of curvature smaller than the first radius of curvature.

12 Claims, 17 Drawing Sheets

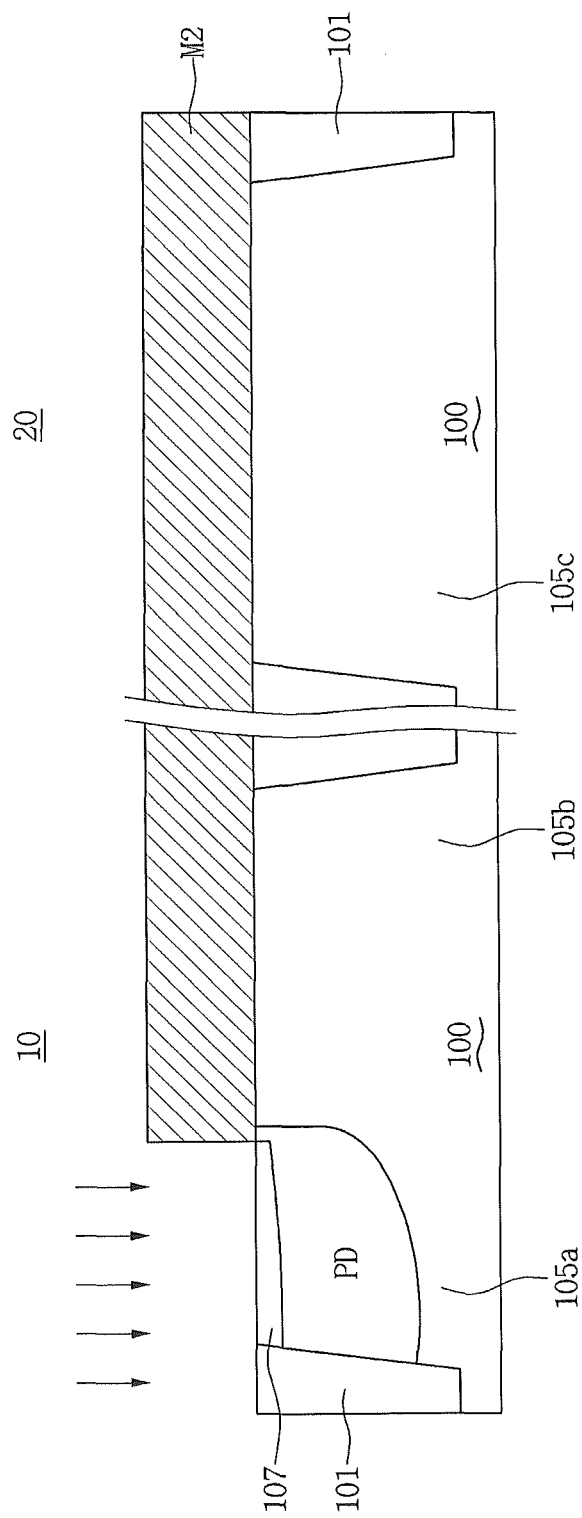

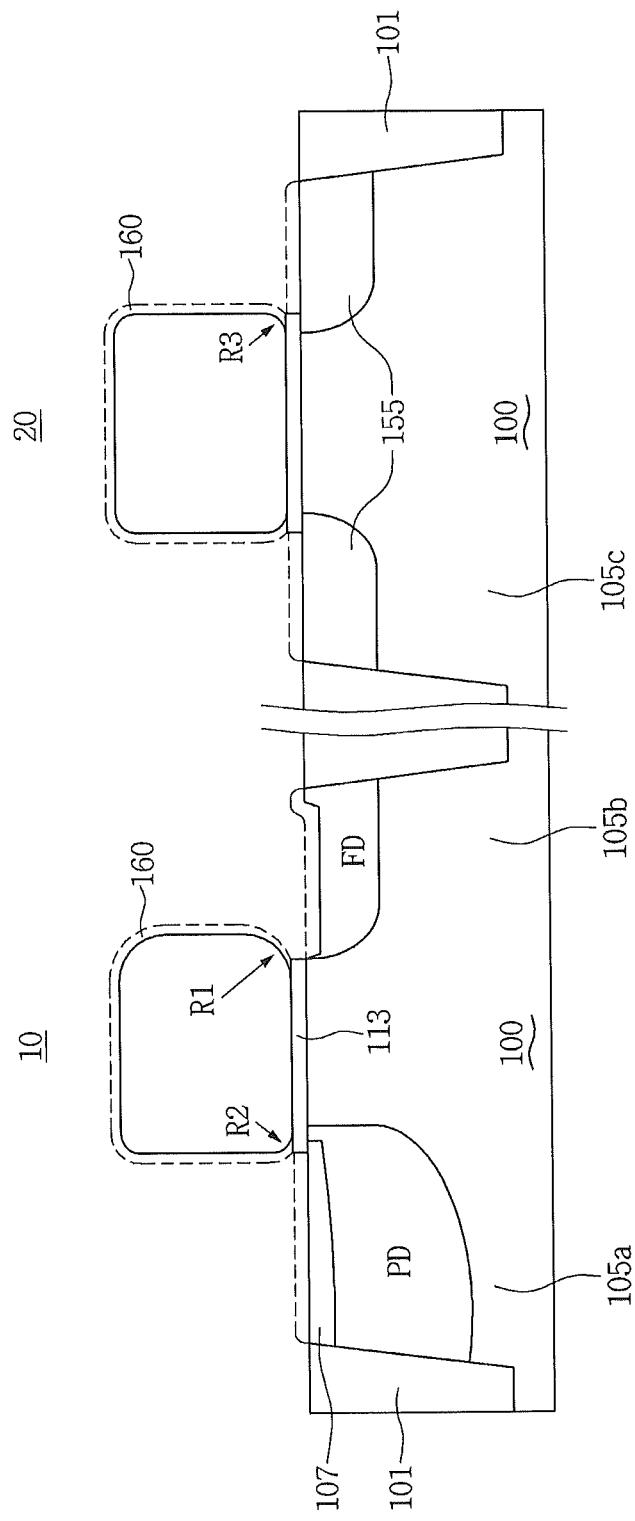

2000

3000

CMOS IMAGE SENSORS HAVING A TRANSFER GATE ELECTRODE, AND METHODS OF FABRICATING CMOS IMAGE SENSORS HAVING A TRANSFER GATE ELECTRODE

CROSS-REFERENCE TO RELATED APPLICATION

This application claims priority under 35 U.S.C. §119 to Korean Patent Application No. 10-2014-0022129, filed on Feb. 25, 2014, the disclosure of which is hereby incorporated by reference herein in its entirety.

BACKGROUND

1. Field

The present disclosure relates to complementary metal-oxide-semiconductor (CMOS) image sensors and methods of fabricating the same.

2. Description of Related Art

In recent years, with the development of information and communications technology (ICT) and digitization of electronic devices, image sensors having improved performance have been used in various fields of, for example, digital cameras, camcorders, portable phones, personal communication systems (PCSs), game machines, security cameras, and medical micro cameras. In general, the image sensor may include a pixel array including photodiodes (PDs) and a peripheral circuit region. A unit pixel may include a photodiode PD and a transfer transistor. The transfer transistor may be disposed between the photodiode PD and a floating diffusion region and may transfer charges generated by the photodiode PD to the floating diffusion region.

SUMMARY

Some embodiments of present inventive concepts provide a complementary metal-oxide-semiconductor (CMOS) image sensor, which may prevent an electric field crowding effect and reduce a gate-induced drain leakage (GIDL) current.

Some embodiments of present inventive concepts provide a method of fabricating the CMOS image sensor, which may prevent an electric field crowding effect and reduce a GIDL current.

In accordance with an aspect of present inventive concepts, a CMOS image sensor includes a substrate including a pixel array and a peripheral circuit region, a photodiode and a floating diffusion region formed in the pixel array of the substrate, a transfer gate insulating layer and a transfer gate electrode formed on the substrate between the photodiode and the floating diffusion region, and a peripheral gate insulating layer and a peripheral gate electrode formed on the peripheral circuit region. The transfer gate electrode includes a first edge that is rounded to have a first radius of curvature. The peripheral gate electrode includes a second edge that is rounded to have a second radius of curvature smaller than the first radius of curvature.

In accordance with another aspect of present inventive concepts, a CMOS image sensor includes a photodiode formed on a substrate, a floating diffusion region spaced a predetermined distance apart from the photodiode and formed on the substrate, and a transfer gate insulating layer and a transfer gate electrode formed on the substrate between the photodiode and the floating diffusion region. A top surface of the substrate on which the photodiode is formed is at a higher level than a top surface of the substrate on which the floating diffusion region is formed.

In accordance with another aspect of present inventive concepts, a method of fabricating a CMOS image sensor includes forming a device isolation layer on a substrate to define a pixel active region, forming a photodiode on the pixel active region, forming a floating diffusion region in the substrate to be spaced apart from the photodiode, forming a transfer gate insulating layer and a transfer gate electrode overlapping the photodiode and the floating diffusion region, forming an mask pattern to expose a first edge of the transfer gate electrode on the floating diffusion region and the floating diffusion region, rounding the first edge and recessing the exposed floating diffusion region, removing the etch mask pattern, and oxidizing surfaces of the transfer gate electrode and the substrate.

Specific particulars of other embodiments are included in detailed descriptions and drawings.

BRIEF DESCRIPTION OF THE DRAWINGS

The foregoing and other features and advantages of present inventive concepts will be apparent from the more particular description of various embodiments of present inventive concepts, as illustrated in the accompanying drawings in which like reference characters refer to the same parts throughout the different views. The drawings are not necessarily to scale, emphasis instead being placed upon illustrating the principles of present inventive concepts. In the drawings:

FIGS. 4A through 4H are cross-sectional views taken along lines I-I' and II-II' of FIG. 2, illustrating a method of fabricating a CMOS image sensor according to some embodiments of present inventive concepts;

DETAILED DESCRIPTION

Figure 1:
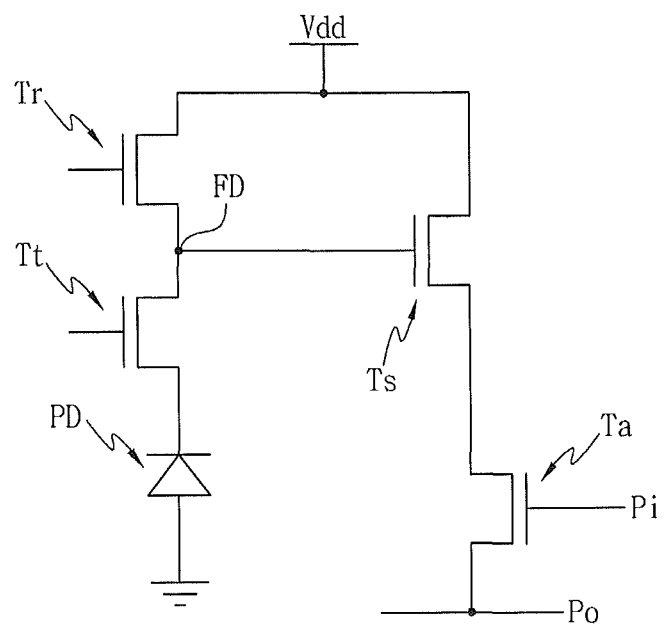
FIG. 1 is an equivalent circuit diagram of a unit pixel included in a complementary metal-oxide-semiconductor (CMOS) image sensor according to some embodiments of present inventive concepts.

Present inventive concepts will now be described more fully hereinafter with reference to the accompanying drawings, in which various embodiments of present inventive concepts are shown. Present inventive concepts may, however, be embodied in different forms and should not be construed as limited to embodiments set forth herein. Rather, these embodiments are provided so that this disclosure is thorough and complete and fully conveys the scope of present inventive concepts to one skilled in the art.

The terminology used herein is for the purpose of describing particular embodiments only and is not intended to be limiting of present inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. It will be understood that when a film (or layer) is referred to as being "on" another film (or layer) or substrate, it can be directly on the other film (or layer) or substrate or intervening films (or layers) may also be present. In the drawings, the sizes or thicknesses of layers and regions are exaggerated for clarity. It will be understood that, although the terms first, second, etc. may be used herein to describe various elements, components, regions, films (or layers) and/or sections, these elements, components, regions, films (or layers) and/or sections should not be limited by these terms. Thus, a first element, component, region, film (layer) or section discussed below could be termed a second element, component, region, film (layer) or section without departing from the teachings of present inventive concepts. Each of embodiment described herein may include a complementary embodiment thereto. As used herein, the term "and/or" includes any and all combinations of one or more of the associated listed items.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

FIG. 1 is an equivalent circuit diagram of a unit pixel of a complementary metal-oxide-semiconductor (CMOS) image sensor according to some embodiments of present inventive concepts.

Referring to FIG. 1, the unit pixel of the CMOS image sensor according to some embodiments of present inventive concepts may include a photodiode PD, a transfer transistor Tt, a reset transistor Tr, a sensing transistor Ts, and an access transistor Ta.

One terminal of the photodiode PD may be connected to a source of the transfer transistor Tt, and the other terminal of the photodiode PD may be grounded.

A drain of the transfer transistor Tt may be connected to a floating diffusion region FD.

A source of the reset transistor Tr may be connected to the floating diffusion region FD, and a drain of the reset transistor Tr may be connected to a power supply voltage Vdd.

A gate of the sensing transistor Ts may be connected to the floating diffusion region FD, and a drain of the sensing transistor Ts may be connected to the power supply voltage Vdd. A source of the sensing transistor Ts may be connected to a drain of the access transistor Ta.

A source of the access transistor Ta may be connected to an output port Po, and a gate of the access transistor Ta may be connected to an input port Pi.

Charges generated by the photodiode PD may be transferred to the floating diffusion region FD by the transfer transistor Tt and accumulated. The charges accumulated in the floating diffusion region FD may be applied to the gate of the sensing transistor Ts and may turn on the sensing transistor Ts. The sensing transistor Ts may supply a power supply voltage Vdd to the access transistor Ta according to the quantity of the charges. When a turn-on voltage is applied from the input port Pi to the gate of the access transistor Ta, the access transistor Ta may be turned on so that an electric signal corresponding to the quantity of the charges applied to the gate of the sensing transistor Ts may be output to the output port Po. Thereafter, when the reset transistor Tr is turned on, the floating diffusion region FD may be charged with a power supply voltage Vdd. The same voltage as the power supply voltage Vdd may be applied to the input port Pi, the gate of the transfer transistor Tt, and the gate of the reset transistor Tr.

Figure 2:
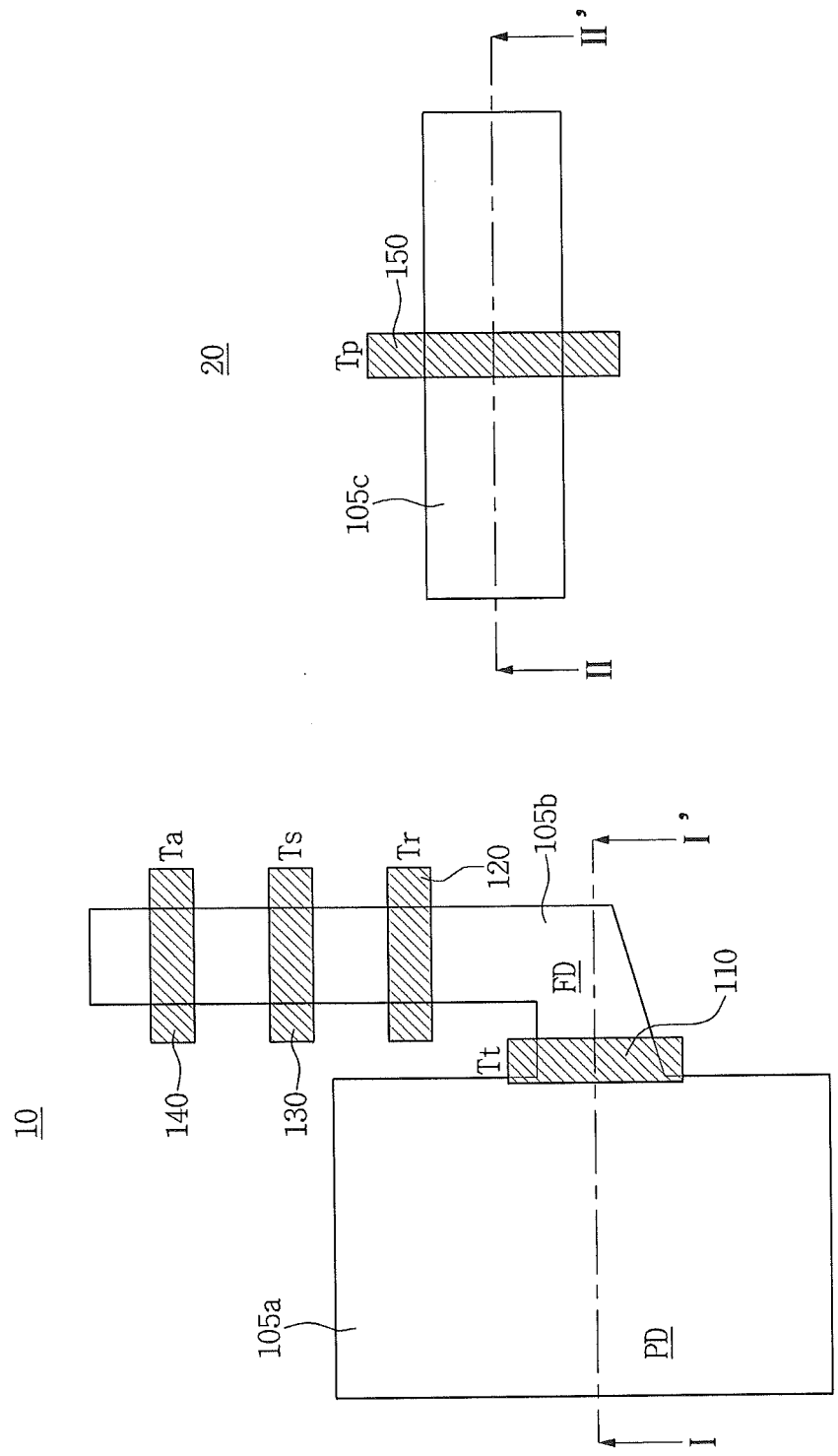
FIG. 2 is a layout of a CMOS image sensor according to some embodiments of present inventive concepts.
Figure 3:
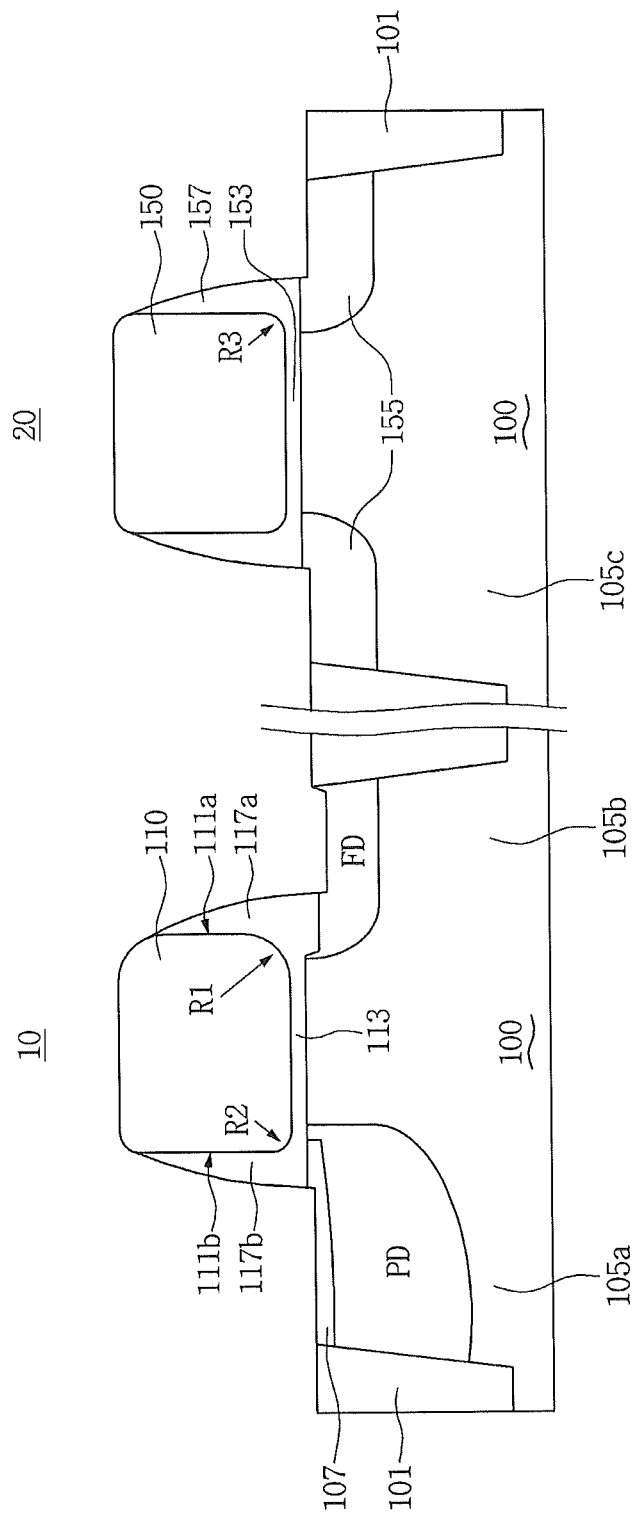
FIG. 3 is a cross-sectional view taken along lines I-I' and II-II' of FIG. 2.

FIG. 2 is a layout of a CMOS image sensor according to some embodiments of present inventive concepts, and FIG. 3 is a cross-sectional view taken along lines I-I' and II-II' of FIG. 2.

Referring to FIG. 2, the CMOS image sensor according to some embodiments of present inventive concepts may include a pixel array 10 and a peripheral circuit region 20. The CMOS image sensor may include a first pixel active region 105a and a second pixel active region 105b disposed in the pixel array 10. The CMOS image sensor may include a photodiode PD disposed in the first pixel active region 105a. The CMOS image sensor may include a reset gate electrode 120 of a reset transistor Tr, a sensing gate electrode 130 of a sensing transistor Ts, and an access gate electrode 140 of an access transistor Ta, which may be disposed on the second active region 105b. The order of disposition of the gate electrodes 120, 130, and 140 of the respective transistors Tr, Ts, and Ta shown in FIG. 2 may be only an example. Accordingly, in some embodiments, the order of disposition of the gate electrodes 120, 130, and 140 of the respective transistors Tr, Ts, and Ta may be different. A transfer gate electrode 110 of a transfer transistor Tt may overlap the first pixel active region 105a and the second pixel active region 105b. A floating diffusion region FD may be disposed in the second pixel active region 105b adjacent the transfer gate electrode 110.

The CMOS image sensor may include a peripheral active region 105c disposed in the peripheral circuit region 20. The CMOS image sensor may include a peripheral gate electrode 150 of a peripheral transistor Tp disposed on the peripheral active region 105c.

Referring to FIG. 3, the CMOS image sensor according to some embodiments of present inventive concepts may include device isolation layers 101 disposed in a substrate 100. The device isolation layers 101 may define the first pixel active region 105a and the second pixel active region 105b disposed in the pixel array 10, and the peripheral active region 105c disposed in the peripheral circuit region 20.

The photodiode PD may be disposed in the first pixel active region 105a. The photodiode PD may contain an N-type dopant. The substrate 100 and the photodiode PD may form a PN junction. The photodiode PD may have a (relatively) lower dopant concentration than the substrate 100 so that a large portion of the photodiode PD may form a depletion region.

A pinned doped region 107 may be disposed in an upper portion of the photodiode PD and may abut the surface of the substrate 100. The pinned doped region 107 may include a P-type dopant. The pinned doped region 107 may inhibit a dark current generated in a top surface of the first pixel active region 105a.

The floating diffusion region FD may be formed in the second pixel active region 105b. The floating diffusion region FD may include an N-type dopant.

A transfer gate electrode 110 may be disposed on the substrate 100 between the photodiode PD and the floating diffusion region FD. The transfer gate electrode 110, the photodiode PD, and the floating diffusion region FD may form the transfer transistor Tt shown in FIGS. 1 and 2. The photodiode PD may correspond to a source of the transfer transistor Tt. The floating diffusion region FD may correspond to a drain of the transfer transistor Tt.

The transfer gate electrode 110 may include a first sidewall 111a, which may be adjacent and aligned with and vertically overlap the floating diffusion region FD, and a second sidewall 111b, which may be adjacent and aligned with, and may vertically overlap, the photodiode PD. Each of an upper edge and a lower edge of the first sidewall 111a may be rounded to have a first radius R1 of curvature. Each of an upper edge and a lower edge of the second sidewall 111b may be rounded to have a second radius R2 of curvature. The first radius R1 of curvature may be greater than the second radius R2 of curvature. Thus, the first and second sidewalls 111a and 111b of the transfer gate electrode 110 may be asymmetrical to each other.

A transfer gate insulating layer 113 may be interposed between the transfer gate electrode 110 and the substrate 100. The transfer gate insulating layer 113 may increase in thickness toward both sidewalls 111a and 111b of the transfer gate electrode 110. The thickness of a portion of the transfer gate insulating layer 113 that is aligned with or adjacent the first sidewall 111a of the transfer gate electrode 110 may be greater than the thickness of a portion of the transfer gate insulating layer 113 that is aligned with or adjacent the second sidewall 111b thereof.

Transfer gate spacers 117a and 117b may be formed on the sidewalls 111a and 111b of the transfer gate electrode 110. A first transfer gate spacer 117a disposed on the first sidewall 111a of the transfer gate electrode 110 may have a greater maximum horizontal thickness than a second transfer gate spacer 117b disposed on the second sidewall 111b of the transfer gate electrode 110. For example, the first transfer gate spacer 117a adjacent the transfer gate insulating layer 113 may have a greater horizontal thickness than the second transfer gate spacer 117b adjacent the transfer gate insulating layer 113.

A top surface of the pinned doped region 107 may be recessed. For example, the top surface of the pinned doped region 107 may be disposed at a lower level than a top surface of the substrate 100 on which the transfer gate insulating layer 113 is disposed. A top surface of the device isolation layer 101 adjacent the pinned doped region 107 may be recessed like the top surface of the pinned doped region 107. Although FIG. 3 illustrates a case in which the top surface of the device isolation layer 101 is coplanar or almost coplanar with the top surface of the pinned doped region 107, the top surface of the device isolation layer 101 may be recessed to a further lower level below the top surface of the pinned doped region 107.

A top surface of the floating diffusion region FD may be recessed in a stepwise form. For example, the first transfer gate spacer 117a may be disposed on a high top surface of the floating diffusion region FD. A low top surface of the floating diffusion region FD may be disposed at a lower level than the top surface of the pinned doped region 107. The top surface of the device isolation layer 101 adjacent the floating diffusion region FD may be disposed at a higher level than the low top surface of the floating diffusion region FD.

A peripheral gate electrode 150 may be disposed on the peripheral active region 105c. Edges of the peripheral gate electrode 150 may have symmetrically rounded structures. For example, a radius R3 of curvature of each of lower edges of sidewalls of the peripheral gate electrode 150 may be smaller than the radius R1 of curvature of the lower edge of the first sidewall 111a of the transfer gate electrode 110. In addition, the radius R3 of curvature of the lower edges of the sidewalls of the peripheral gate electrode 150 may be similar or substantially equal to the radius R2 of curvature of the lower edge of the second sidewall 111b of the transfer gate electrode 110.

A peripheral gate insulating layer 153 may be interposed between the peripheral gate electrode 150 and the substrate 100. The peripheral gate insulating layer 153 may increase in thickness toward sidewalls of the peripheral gate electrode 150.

Peripheral gate spacers 157 may be formed on both sidewalls of the peripheral gate electrode 150. The peripheral gate insulating layer 153 and the peripheral gate spacers 157 may include silicon oxide.

Source and drain regions 155 may be disposed on both sidewalls of the peripheral gate electrode 150. Top surfaces of the source and drain regions 155 may be recessed in a stepwise form. For example, the peripheral gate spacers 157 may be disposed on high top surfaces of the source and drain regions 155. Low top surfaces of the source and drain regions 155 may be recessed to a lower level than the top surface of the substrate 100 on which the peripheral gate insulating layer 153 is disposed. Top surfaces of the device isolation layers 101 adjacent the source and drain regions 155 may be recessed like the top surfaces of the source and drain regions 155. Although FIG. 3 illustrates a case in which the top surface of the device isolation layer 101 is coplanar or almost coplanar with the top surfaces of the source and drain regions 155, the top surface of the device isolation layer 101 may be recessed to a further lower level below the top surfaces of the source and drain regions 155.

In the CMOS image sensor according to some embodiments of present inventive concepts, the thickness of the transfer gate insulating layer 113 may increase in a portion of the pixel array 10 in which the transfer gate electrode 110 overlaps the floating diffusion region FD, thereby reducing an electric field crowding effect. Thus, a gate-induced drain leakage (GIDL) current may be reduced to improve electrical properties of the CMOS image sensor.

FIGS. 4A through 4E are cross-sectional views taken along lines I-I' and II-II' of FIG. 2, illustrating a method of fabricating a CMOS image sensor according to some embodiments of present inventive concepts.

Figure 4A:
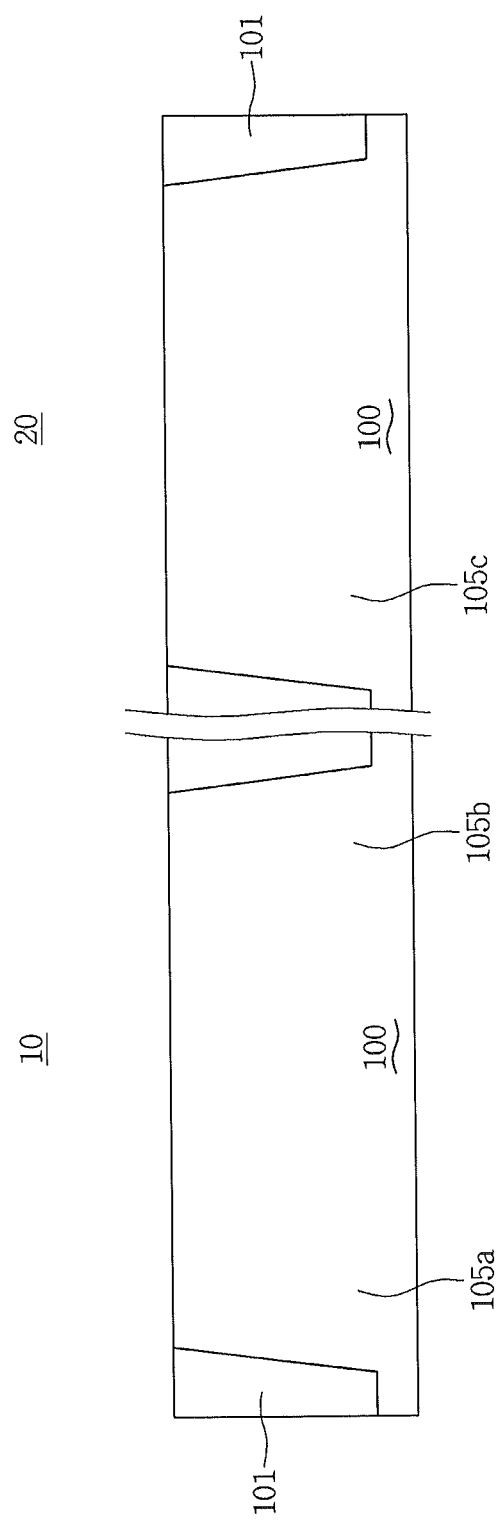

Referring to FIG. 4A, the method of fabricating the CMOS image sensor according to some embodiments of present inventive concepts may include preparing a substrate 100 including a pixel array 10 and a peripheral circuit region 20 and performing a shallow trench isolation (STI) process to form device isolation layers 101 in the substrate 100. The STI process may include forming a trench in the substrate 100 and filling the trench with an insulating material. The substrate 100 may include any one of a silicon wafer, a silicon-on-insulator (SOI) substrate, or an epitaxial growth layer. The device isolation layers 101 may define a first pixel active region 105a, a second pixel active region 105b, and a peripheral active region 105c.

Figure 4B:
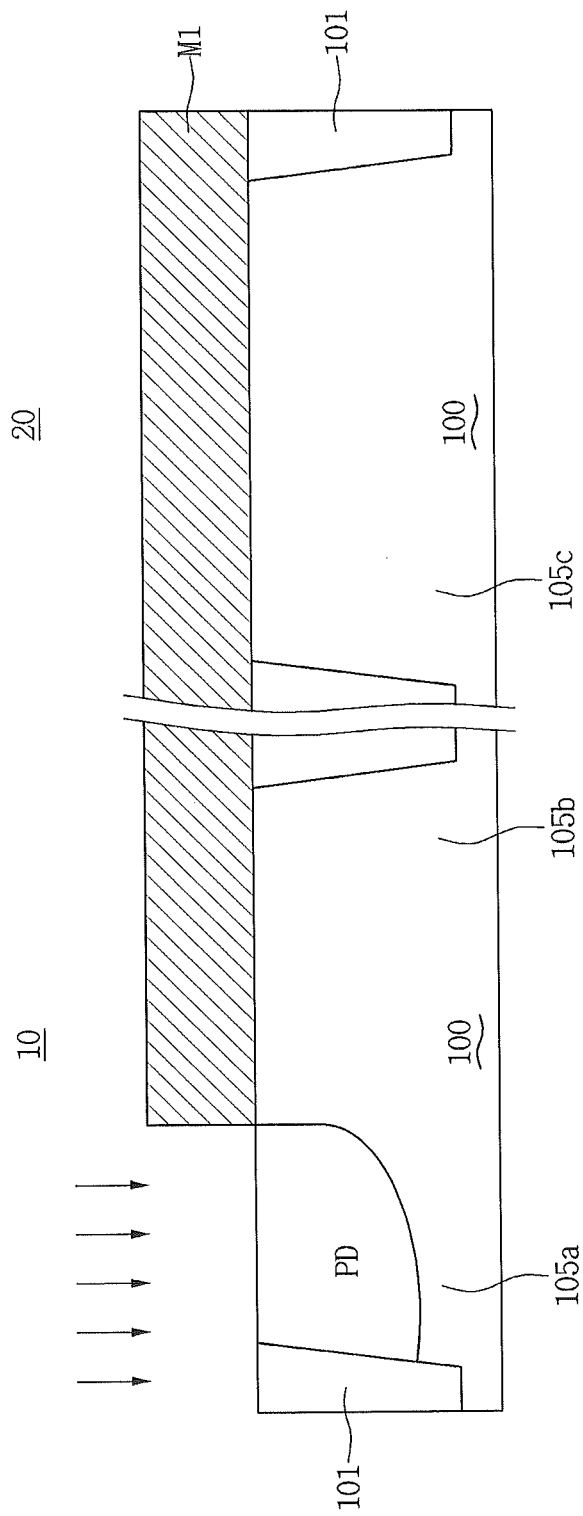

Referring to FIG. 4B, the method may include performing a first ion implantation process to form a photodiode PD in the first pixel active region 105a. The first ion implantation process may include forming a first ion implantation mask M1 on the substrate 100 to expose a region in which the photodiode PD will be formed, and implanting an N-type dopant into the exposed region using the first ion implantation mask M1. The photodiode PD may abut one of the device isolation layers 101 disposed adjacent thereto. Subsequently, the first ion implantation mask M1 may be removed.

Referring to FIG. 4C, the method may include performing a second ion implantation process to form a pinned doped region 107 on the photodiode PD in the substrate 100. The second ion implantation process may include forming a second ion implantation mask M2 on the substrate 100 to expose a region in which the pinned doped region 107 will be formed, and implanting a P-type dopant into the exposed region using the second ion implantation mask M2. The pinned doped region 107 may abut one of the device isolation layers 101 disposed adjacent thereto, and may be confined within the photodiode PD to expose a portion of the photodiode PD in a top view. Subsequently, the second ion implantation mask M2 may be removed.

Figure 4D:
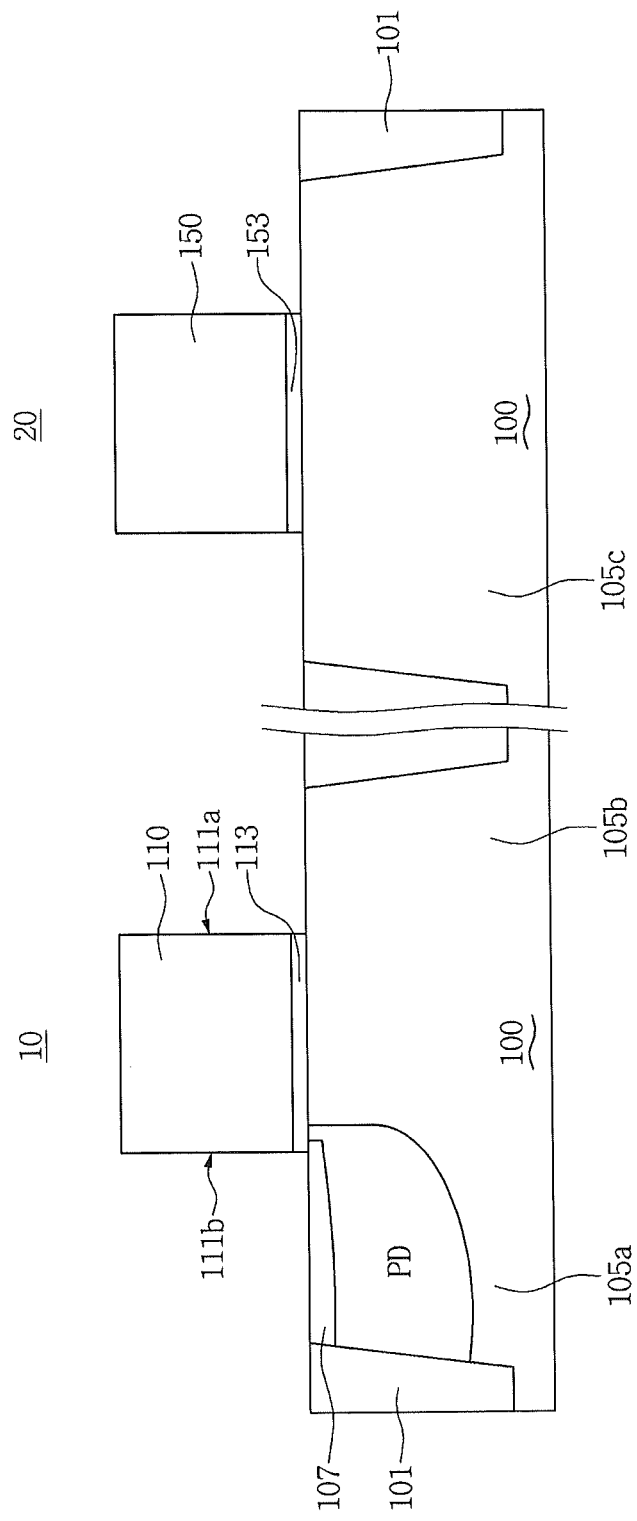

Referring to FIG. 4D, the method may include forming a transfer gate insulating layer 113 and a transfer gate electrode 110 on the pixel array 10 of the substrate 100, and forming a peripheral gate insulating layer 153 and a peripheral gate electrode 150 on the peripheral circuit region 20 of the substrate 100. The transfer gate electrode 110 may include a first sidewall 111a and a second sidewall 111b. The second sidewall 111b of the transfer gate electrode 110 may be vertically aligned with or may vertically overlap the photodiode PD or the pinned doped region 107. The transfer gate insulating layer 113 and the peripheral gate insulating layer 153 may include oxidized silicon formed using a thermal oxidation process. The transfer gate electrode 110 and the peripheral gate electrode 150 may include a conductor, such as polysilicon (poly-Si).

Figure 4E:
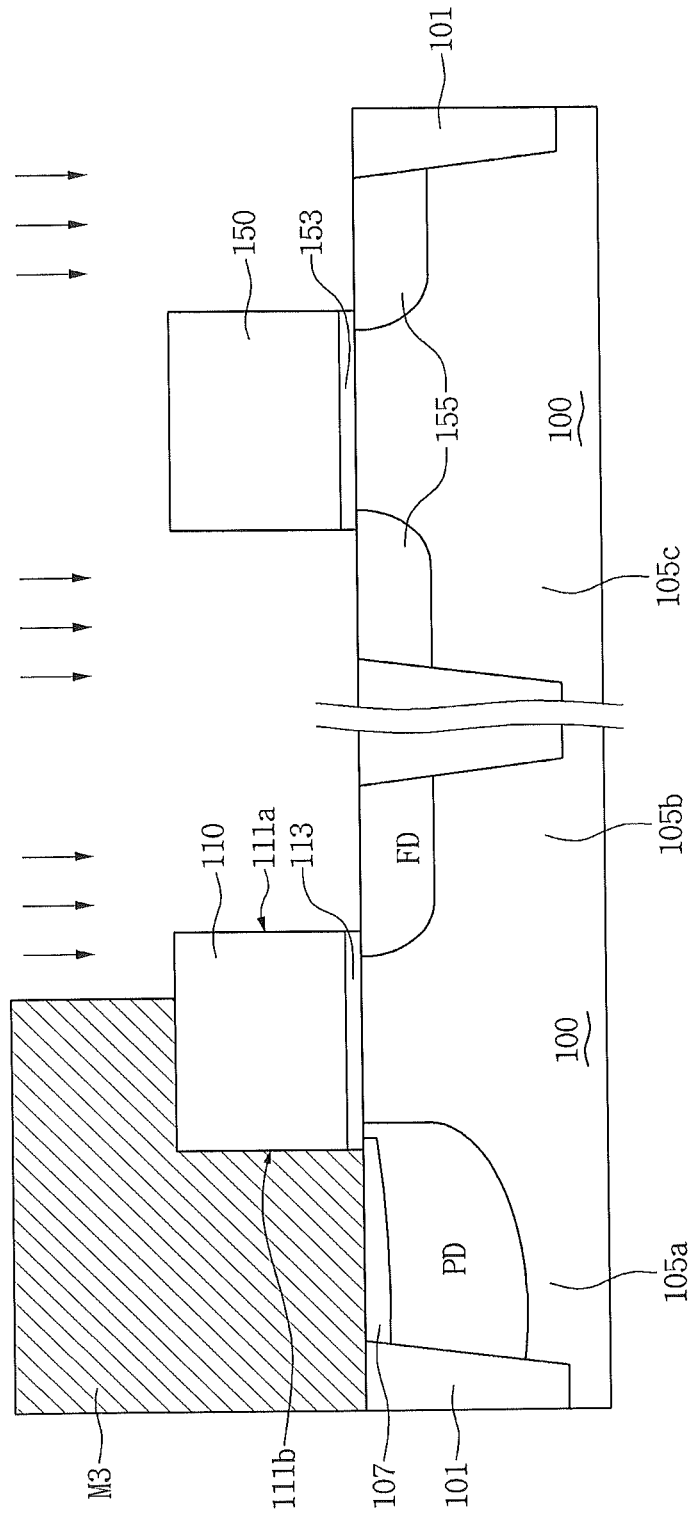

Referring to FIG. 4E, the method may include performing a third ion implantation process to form a floating diffusion region FD and peripheral source and drain regions 155. The third ion implantation process may include forming a third ion implantation mask M3 to cover the photodiode PD and a portion of the transfer gate electrode 110 and to expose the second pixel active region 105b and the peripheral active region 105c, and implanting an N-type dopant into the exposed second pixel active region 105b and the peripheral active region 105e using the third ion implantation mask M3. The floating diffusion region FD may be adjacent and aligned with, and may be vertically overlapped by, the first sidewall 111a of the transfer gate electrode 110. The peripheral source and drain regions 155 may be adjacent and aligned with, and may be vertically overlapped by, both sidewalls of the peripheral gate electrode 150.

Thus, the transfer transistor Tt may be formed on the pixel array 10, and the peripheral transistor Tp may be formed on the peripheral circuit region 20. The transfer transistor Tt may transfer charges generated by the photodiode PD to the floating diffusion region FD. The peripheral transistor Tp may be used for a CMOS control circuit configured to read signals output by a unit pixel. Subsequently, the third ion implantation mask M3 may be removed.

Figure 4F:
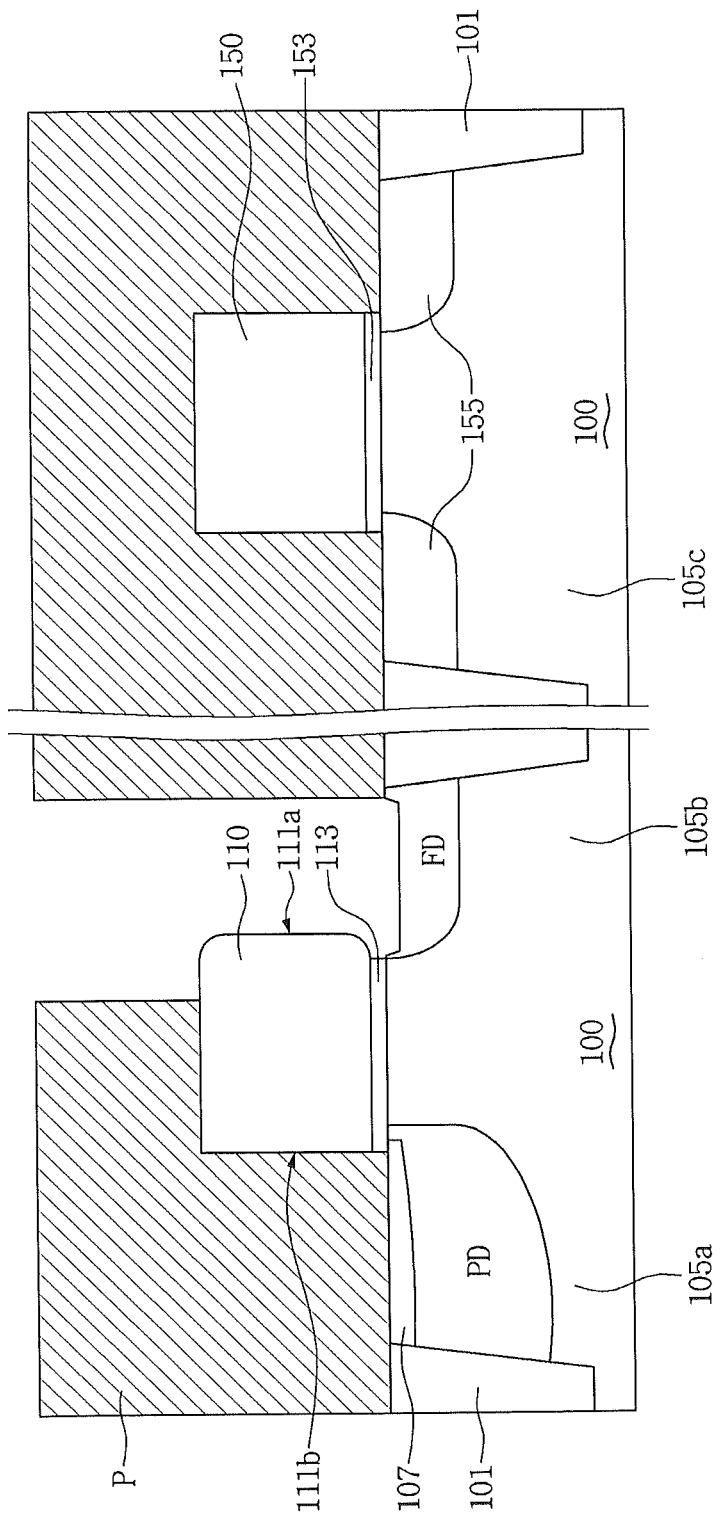

Referring to FIG. 4F, the method may include forming a photoresist pattern P on the substrate 100 to expose the floating diffusion region FD and the first sidewall 111a of the transfer gate electrode 110, and performing a wet etching process using the photoresist pattern P as an etch mask to round an upper edge and a lower edge of the first sidewall 111a of the transfer gate electrode 110. The transfer gate insulating layer 113 may be partially removed using the wet etching process, and horizontally recessed. In addition, a top surface of the floating diffusion region FD may be partially etched and recessed. Accordingly, the top surface of the floating diffusion region FD may be disposed at a lower level than a top surface of the photodiode PD and top surfaces of the peripheral source and drain regions 155 of the peripheral circuit region 20. The wet etching process may be performed using a fluoric acid (HF)-containing etchant, such as a buffered oxide etchant (BOE). Thereafter, the photoresist pattern P may be removed.

Referring to FIG. 4G, the method may include performing a thermal oxidation process to form an oxidized silicon layer 160 on the transfer gate electrode 110, the peripheral gate electrode 150, and the exposed surface of the substrate 100. Thus, an upper edge and a lower edge of the second sidewall 111b of the transfer gate electrode 110 and all edges of the peripheral gate electrode 150 may be rounded. The upper and lower edges of the first sidewall 111a of the transfer gate electrode 110 may be further rounded. Accordingly, the upper and lower edges of the first sidewall 111a of the transfer gate electrode 110 may have a greater radius of curvature than the upper and lower edges of the second sidewall 111b of the transfer gate electrode 110 and the edges of the peripheral gate electrode 150. For example, the upper and lower edges of the first sidewall 111a of the transfer gate electrode 110 may have a first radius R1 of curvature, and the upper and lower edges of the second sidewall 111b of the transfer gate electrode 110 may have a second radius R2 of curvature smaller than the first radius R1 of curvature. Also, the edges of the peripheral gate electrode 150 may have a third radius R3 of curvature smaller than the first radius R1 of curvature. The second radius R2 of curvature may be substantially equal or similar to the third radius R3 of curvature.

Figure 4H:
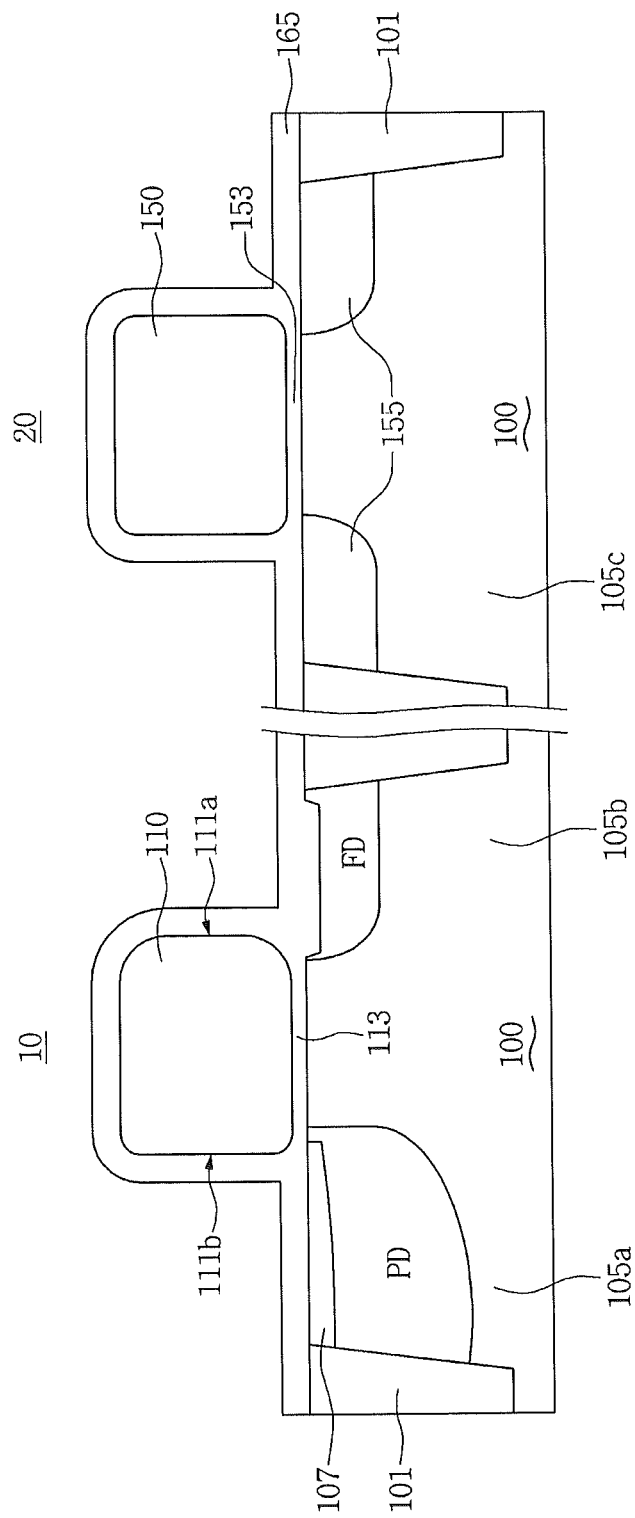

Referring to FIG. 4H, the method may include performing a deposition process to form a spacer insulating layer 165 on entire surfaces of the pixel array 10 and the peripheral circuit region 20. The deposition process may include forming silicon oxide using a chemical mechanical polishing (CMP) process. When the spacer insulating layer 165 includes silicon oxide, the spacer insulating layer 165 and the oxidized silicon layer 160 may be unified so that a boundary therebetween may disappear. Accordingly, the boundary between the spacer insulating layer 165 and the oxidized silicon oxide layer 160 may be omitted, and only the spacer insulating layer 165 may be indicated. Moreover, the transfer gate insulating layer 113 may be considered unified with the spacer insulating layer 165 and/or the oxidized silicon layer 160. Accordingly, a thickness of the transfer gate insulating layer 113 described herein may be a thickness that includes a combination of the transfer gate insulating layer 113 with the spacer insulating layer 165 and/or the oxidized silicon layer 160. Similarly, a thickness of the peripheral gate insulating layer 153 described herein may be a thickness that includes a combination of the peripheral gate insulating layer 153 with the spacer insulating layer 165 and/or the oxidized silicon layer 160.

Thereafter, referring to FIG. 3, the method may include performing an etch-back process on the spacer insulating layer 165 to expose a top surface of the substrate 100 to form transfer gate spacers 117 on both sidewalls of the transfer gate electrode 110 and to form peripheral gate spacers 157 on both sidewalls of the peripheral gate electrode 150. Top surfaces of the device isolation layers 101, a top surface of the pinned doped region 107, a top surface of the transfer gate electrode 110, the top surface of the floating diffusion region FD, and the top surfaces of the peripheral source and drain regions 155 may be exposed. As a result, a CMOS image sensor, which may reduce a leakage current due to GIDL caused by the crowding of an electric field in the edges of the transfer gate electrode 110, may be completed.

Figure 5:
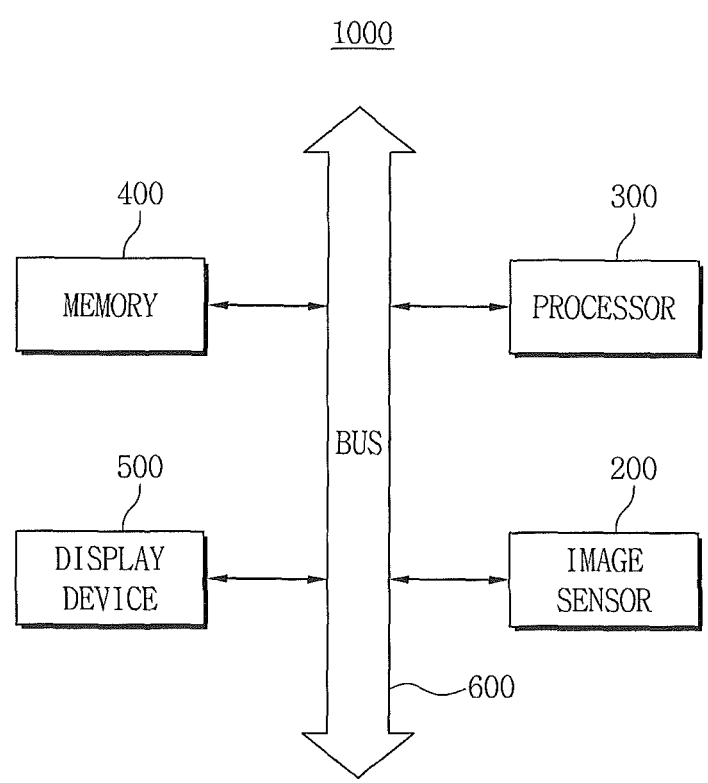
FIG. 5 is a block diagram of an electronic device including an image sensor according to some embodiments of present inventive concepts.

FIG. 5 is a block diagram of an electronic device 1000 including an image sensor according to some embodiments of present inventive concepts. The electronic device may include a personal computer (PC) or another computer, a digital camera, or a mobile device. Referring to FIG. 5, the electronic device may include an image sensor 200, a processor 300, a memory 400, a display device 500, and a bus 600. The image sensor 200 may capture external image information in response to the control of the processor 300. The processor 300 may store the captured image information in the memory 400 through the bus 600. The processor 300 may output the image information stored in the memory 400 to the display device 500.

Figure 6:
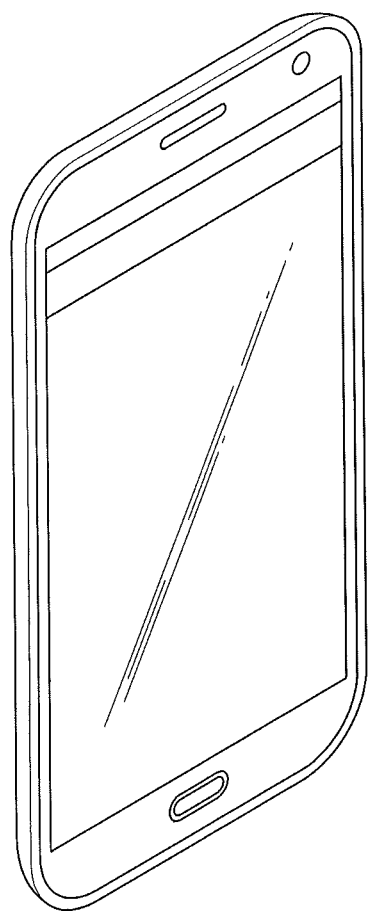
FIGS. 6 through 10 are diagrams of examples of a multimedia device to which an image sensor according to some embodiments of present inventive concepts is applied.
Figure 7:
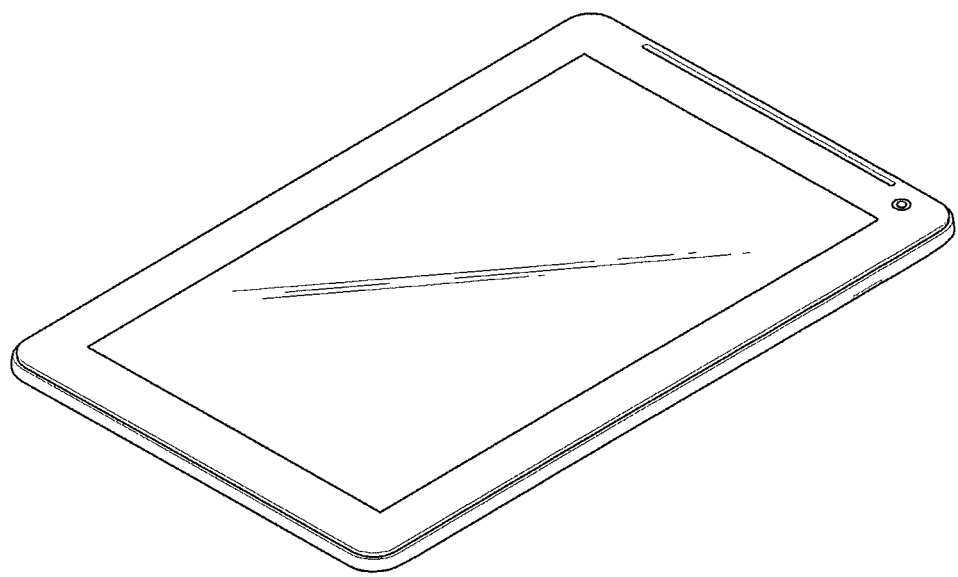
Figure 8:
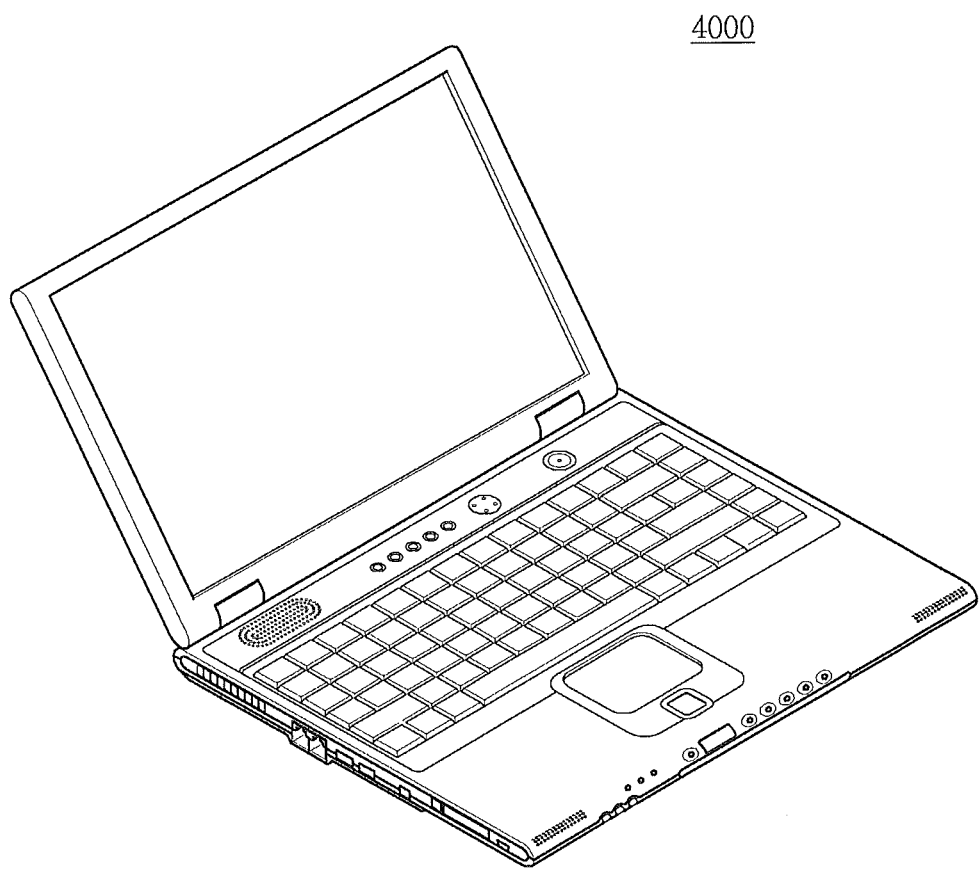
Figure 9:
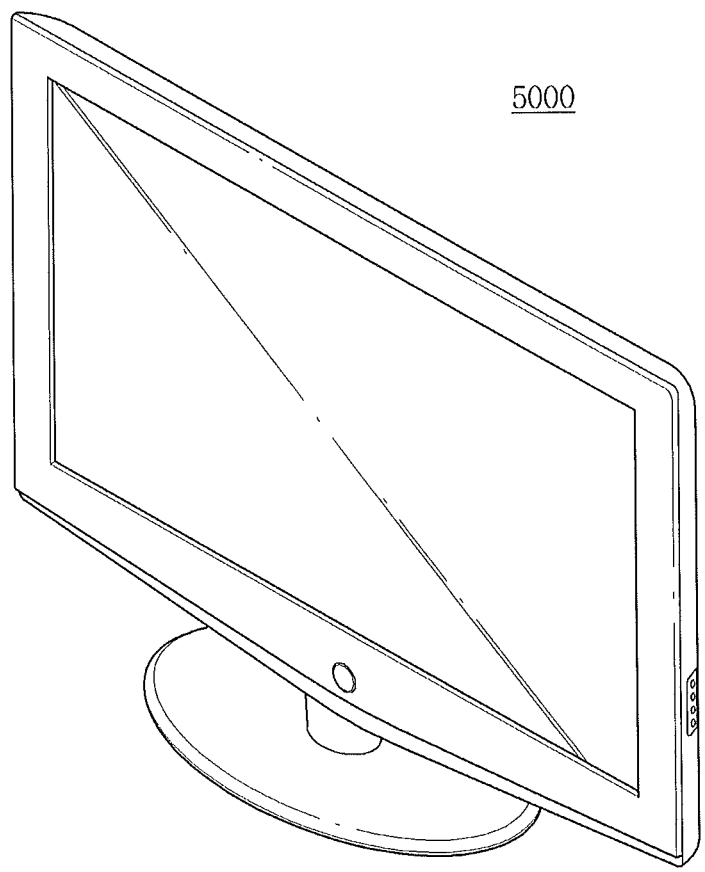
Figure 10:
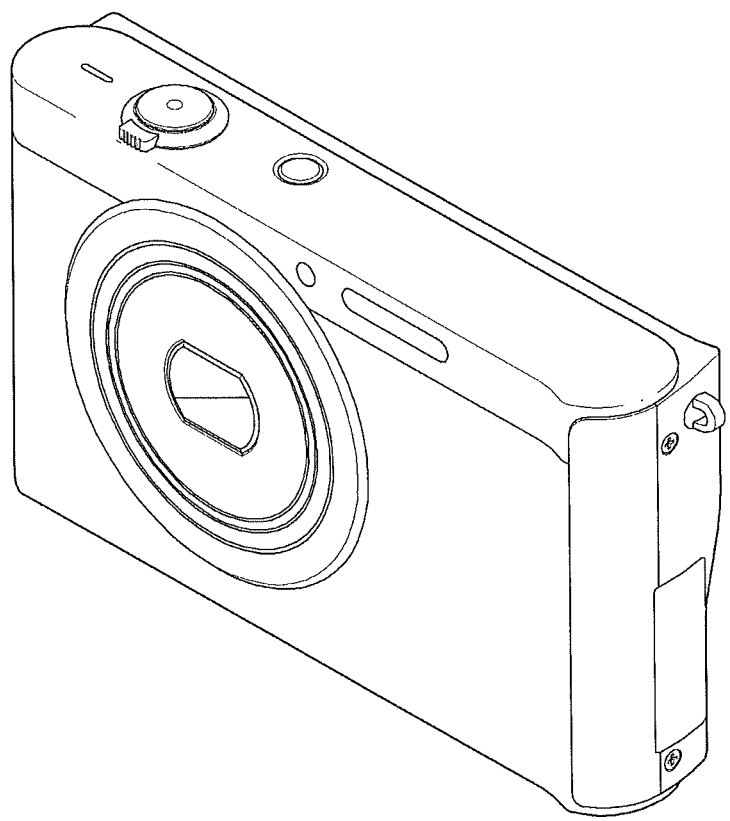

FIGS. 6 through 10 are diagrams of examples of a multimedia device to which an image sensor according to some embodiments of present inventive concepts is applied. The image sensor according to some embodiments of present inventive concepts may be applied to various multimedia devices having image capturing functions. For instance, the image sensor according to some embodiments of present inventive concepts may be applied to a mobile phone or smart phone 2000 as shown in FIG. 6 or applied to a tablet or a smart tablet 3000 as shown in FIG. 7. Also, the image sensor according to some embodiments of present inventive concepts may be applied to a laptop computer 4000 as shown in FIG. 8 or applied to a television or smart television 5000 as shown in FIG. 9. Furthermore, the image sensor according to some embodiments of present inventive concepts may be applied to a digital camera 6000 or a digital camcorder as shown in FIG. 10.

A CMOS image sensor according to some embodiments of present inventive concepts can include a transfer gate electrode having rounded edges. Thus, occurrence of a leakage current due to GIDL caused by the crowding of an electric field between the transfer gate electrode and a floating diffusion region can be inhibited/reduced.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A complementary metal-oxide-semiconductor (CMOS) image sensor comprising:
    a substrate including a pixel array and a peripheral circuit region;
    a photodiode and a floating diffusion region in the pixel array of the substrate;
    a transfer gate insulating layer and a transfer gate electrode on a portion of the substrate that is between the photodiode and the floating diffusion region; and
    a peripheral gate insulating layer and a peripheral gate electrode on the peripheral circuit region,
    wherein the transfer gate electrode includes a first edge that is rounded to have a first radius of curvature,
    wherein the peripheral gate electrode includes a second edge that is rounded to have a second radius of curvature shorter than the first radius of curvature, and
    wherein the transfer gate electrode further comprises a third edge that is rounded to have a third radius of curvature shorter than the first radius of curvature.

2. The CMOS image sensor of claim 1, wherein a first portion of the transfer gate insulating layer adjacent the first edge of the transfer gate electrode is thicker than a second portion of the peripheral gate insulating layer adjacent the second edge of the peripheral gate electrode.

3. The CMOS image sensor of claim 1, further comprising a pinned doped region on the photodiode in the substrate.

4. The CMOS image sensor of claim 3, wherein the pinned doped region includes a first dopant of a first type that is different from a second type of a second dopant included in the photodiode.

5. The CMOS image sensor of claim 1, wherein a lowest portion of a top surface of the floating diffusion region is at a lower level than a lowest portion of a top surface of the pinned doped region.

6. The CMOS image sensor of claim 1, further comprising a reset gate electrode, a sensing gate electrode, and an access gate electrode on the pixel array.

7. The CMOS image sensor of claim 1, further comprising source and drain regions in the substrate and aligned with the peripheral gate electrode.

8. The CMOS image sensor of claim 7, wherein a lowest portion of a top surface of the floating diffusion region is at a lower level than top surfaces of the source and drain regions.

9. The CMOS image sensor of claim 1,
    wherein the first edge is aligned with the floating diffusion region, and
    wherein the third edge is aligned with the photodiode.

10. The CMOS image sensor of claim 1,
    wherein the transfer gate electrode includes a first sidewall aligned with the floating diffusion region, and
    wherein an upper edge of the first sidewall is rounded.

11. The CMOS image sensor of claim 10,
    wherein the transfer gate electrode includes a second sidewall aligned with the photodiode, and
    wherein an upper edge of the second sidewall is rounded.

12. The CMOS image sensor of claim 11, wherein the upper edge of the first sidewall has a longer radius of curvature than the upper edge of the second sidewall.

* * * * *